United States Patent [19]
Fischer

[11] Patent Number: 5,034,801
[45] Date of Patent: Jul. 23, 1991

[54] INTERGRATED CIRCUIT ELEMENT HAVING A PLANAR, SOLVENT-FREE DIELECTRIC LAYER

[75] Inventor: Paul J. Fischer, Wilmington, Del.

[73] Assignee: W. L. Gore & Associates, Inc., Newark, Del.

[21] Appl. No.: 387,852

[22] Filed: Jul. 31, 1989

[51] Int. Cl.⁵ .............................................. H01L 23/28
[52] U.S. Cl. ...................................... 357/72; 357/52; 428/422
[58] Field of Search .................. 428/422, 901; 357/54, 357/72, 52

[56] References Cited

U.S. PATENT DOCUMENTS

| | | | |
|---|---|---|---|
| 4,613,888 | 9/1986 | Mase et al. | 357/54 |
| 4,680,220 | 7/1987 | Johnson | 428/422 |
| 4,720,405 | 1/1988 | Carson et al. | 428/422 |
| 4,731,346 | 3/1988 | Ashwell | 357/54 |
| 4,755,911 | 7/1988 | Suzuki | 428/422 |
| 4,772,509 | 9/1988 | Komada et al. | 428/422 |
| 4,784,901 | 11/1988 | Hatakeyama et al. | 428/422 |
| 4,824,511 | 4/1989 | Hartman et al. | 428/422 |

*Primary Examiner*—Andrew J. James
*Assistant Examiner*—Courtney A. Bowers
*Attorney, Agent, or Firm*—Mortenson & Uebler

[57] ABSTRACT

An integrated circuit element is provided, which may be an active or passive element, comprising a planar dielectric layer having a thickness 25 micrometers or less and a dielectric constant less than 3.4. The dielectric layer is preferably a fluoropolymer film coated or impregnated with a low ionic content resin. The preferred fluoropolymer is expanded polytetrafluoroethylene and the preferred resin component is a low ionic content polymer having a low dielectric constant, high thermal stability, and low thermal expansion, formed by addition polymerization. "Planarity" is defined as the ratio of the height of the dielectric at a point where there is no feature beneath the layer divided by the height of the dielectric over a feature, including the thickness of the feature. All products according to the invention have planarity exceeding 0.8.

17 Claims, 2 Drawing Sheets

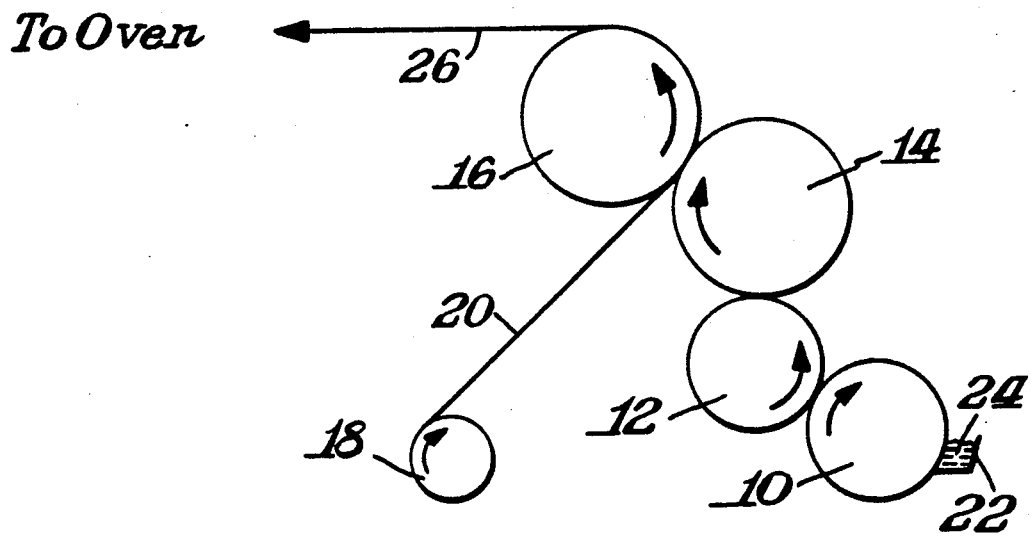
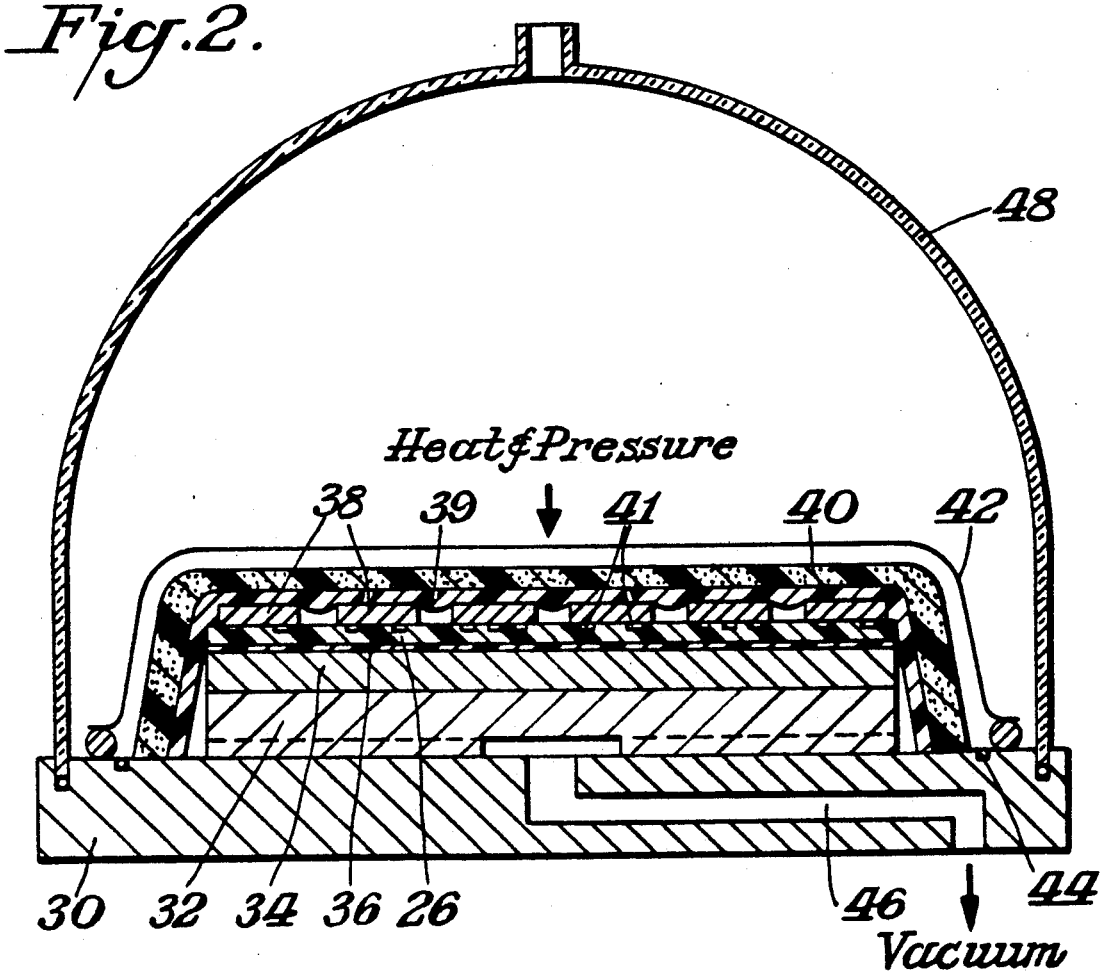

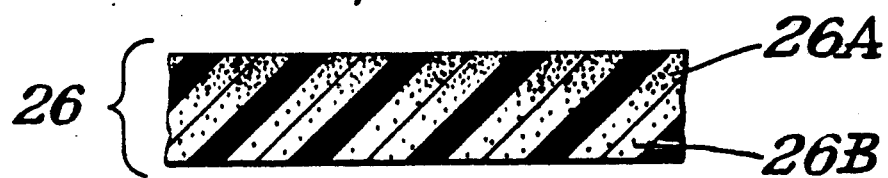
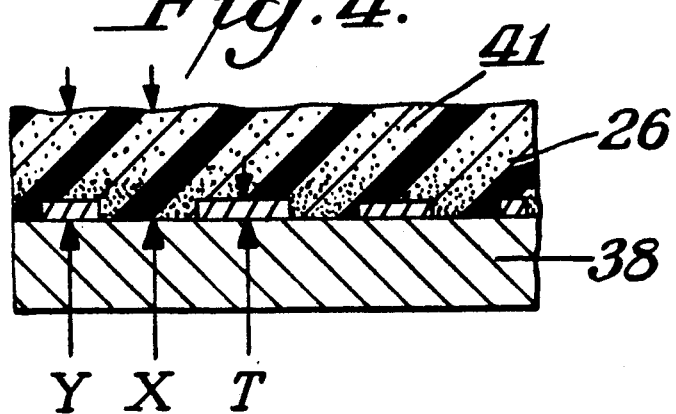
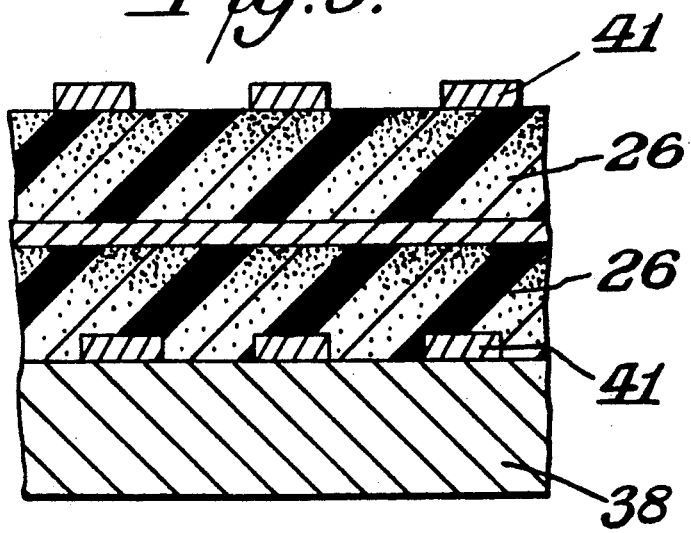

INTERGRATED CIRCUIT ELEMENT HAVING A PLANAR, SOLVENT-FREE DIELECTRIC LAYER

BACKGROUND OF THE INVENTION

The invention relates to prepreg sheets useful as a dielectric layer in an integrated circuit element.

Integrated circuit geometries, over time, have become smaller and smaller. As a result, the density of the element packaging has become higher and higher. The evolution in packaging has been from printed wiring boards to thick film multilayer ceramics to thin multilayer polymers, as well as multilayer ceramic in combination with thin multilayer polymers, the latter being perhaps 60 times better than printed wiring boards in terms of size to weight ratio, power delays, relative cost, density and time delay.

For thin film multilayer polymers, the ideal polymer would have a low dielectric constant, low thermal expansion, good physical properties such as high elongation and high fracture toughness, good adhesion, low water absorption, thermal stability to 400° C. and low solvent absorption. It must be processible so as to produce thin, pinhole-free layers. At present, the polymer of choice is a polyimide and the conventional process employs spinning of the polymer (dissolved in a solvent) on a rotating wafer substrate to form a film. This process is discussed, for example, in Betram, W. J., Jr., "High-Density, Large Scale Interconnection for Improved VLSI System Performance", *Proceedings of the IEDM-International Electron Devices Meeting*, Washington, D. C., Dec. 6-9, 1987.

The requirements for the interlevel dielectric layers are that the material have as low a dielectric constant as possible, that the material planarize as much as possible the structure of the underlying conductor levels and that processes exist to define the vias which interconnect the levels of metallization. The material of choice is a commercialy available polyimide.

The polyimide material is applied using spinning techniques in commercial equipment developed for the application of photoresistant material. The desired thicknesses of 5 micrometers and 10 micrometers are obtainable and the top surface meets the requirements for planarity by this method. Polymers suitable for application by this process include the PYRALIN ® family of polyimides available from DuPont, as well as similar polymers available from others. These are all condensation polymers. Dow Chemical Co. markets a polymer, Benzocyclobutene, used for the same applications sold under the trademark BCB which is an addition reaction polymer. The polymer in solution is puddled onto a wafer and spun, typically at 5000 rpm for 30 seconds, resulting in air drying of the material. Polymer properties and processing details are available in the product information brochures produced by DuPont, e.g., "PYRALIN ® LX Processing Guidelines", May 17, 1988.

In the spinning process, up to 90-95% of the polymer solution is wasted by being spun off of the spinning wafer due to centrifugal force effects. These coating materials presently typically cost one dollar per gram of material, resulting in huge waste expenses to produce quite thin coatings.

Advantages of the currently used process and product include a dielectric constant ranging from 2.7 to 3.5, good thermal stability to 400° C. and low thermal expansion. Disadvantages include the high cost of coatings and the low material utilization due to spinning. Many spinning steps are required and the rheology of the polymer solutions is the critical process control variable.

A printed circuit board base prepreg material is disclosed in U.S. Pat. No. 4,772,509. That reference discloses a printed circuit board base prepreg material of a porous, expanded polytetrafluoroethylene (PTFE) membrane or fabric impregnated with a polyimide resin varnish. Upon curing, a printed circuit board base material of porous, expanded PTFE impregnated with polyimide resin is provided. The base material of the invention may be laminated to a glass fabric to improve strength and dimensional stability.

See, also, Chao, Clinton C., et al, "Multilayer Thin-Film Substrate for Multichip Packaging", *Proceedings of the 38th Electronic Components Conference*, 1988, IEEE.

By definition, the term "planarity" as used herein is defined as the ratio of the height of the dielectric at a point where there is no feature underneath the layer divided by the height of the dielectric over a feature, including the thickness of the feature. The feature thickness is less than 50% of the dielectric thickness when the dielectric is measured at a point without a feature. Thus, a perfectly flat dielectric would have a planarity of 1.0 and a perfectly conformal coating where the feature thickness is 50% of the dielectric thickness plus the feature thickness would have a planarity of 0.5.

In a sequentially constructed, high-density interconnect, i.e., any conductive network between the outside world and devices on the integrated circuit that are defined by high resolution photo imaging, planarity is a critical variable for producing reliable electrical interconnects. The dielectric must encapsulate the signal lines of a previous layer while providing a nearly flat surface for imaging the next signal layer. The reason that this flatness is required is two-fold. First, the equipment for imaging fine lines exists currently in the semiconductor industry. This equipment can achieve very fine line resolution but requires a flat surface due to a very short focal length. Therefore, if the surface is not highly planar, line geometries cannot be controlled accurately, and, in the worst case, lines may disappear causing unwanted opens (shorts), resulting in failures. Second, a high degree of planarity is required for impedance control. The spacing between signal and ground must remain constant along a signal path. Failure to do so can result in signal transmissions of poor quality.

SUMMARY OF THE INVENTION

An integrated circuit element is provided comprising a base substrate or multilayer base substrate having an integrated electric circuit thereon, the circuit being covered by a planar dielectric layer. The dielectric layer comprises a porous plastic matrix layer containing within at least some of its pores a dielectric polymer. The planarity of the applied dietric layer is at least 0.8. The dielectric layer has a dielectric constant less than 3.4 and may have a dielectric constant less than 2.7. The dielectric polymer may be contained within substantially all of the pores of the porous plastic matrix layer. The dielectric polymer may be formed as a coating on the porous plastic matrix layer, the coating being adjacent the electric circuit. The dielectric layer has a thickness of 25 micrometers or less.

A multiple layer integrated circuit is also provided comprising a plurality of integrated circuit laminates bonded together.

The matrix layer preferably is porous, expanded polytetrafluoroethylene having a thickness of 25 micrometers or less and a dielectric constant less than 2.8. The base wafer or circuit may be silicon, gallium arsenide or ceramic. The dielectric polymer is preferably a thermosetting polymer such as a cyanate ester or other low ionic content addition polymerizable resin.

BRIEF DESCRIPTION OF THE DRAWINGS

FIG. 1 is a schematic diagram of gravure roll apparatus showing a process for producing the composite dielectric according to the invention.

FIG. 2 is a schematic diagram of apparatus and a process for making a printed circuit element according to the invention.

FIG. 3 is a schematic cross-sectional view of the composite dielectric of the invention.

FIG. 4 is a schematic cross-sectional view of an integrated circuit according to the invention.

FIG. 5 is a multilayer integrated circuit element.

DETAILED DESCRIPTION OF THE INVENTION AND PREFERRED EMBODIMENTS WITH REFERENCE TO THE DRAWINGS

An integrated circuit element is provided, which may be an active or passive element, comprising a planar dielectric layer having a thickness of 25 micrometers or less and a dielectric constant less than 3.4. The dielectric layer is preferably a fluoropolymer film coated or impregnated with a low ionic content resin. The preferred fluoropolymer is expanded polytetrafluoroethylene and the preferred resin component is a low ionic content polymer having a low dielectric constant, high thermal stability, and low thermal expansion, formed by addition polymerization. "Planarity" is defined as the ratio of the height of the dielectric at a point where there is no feature beneath the layer divided by the height of the dielectric over a feature, including the thickness of the feature. All products according to the invention have planarity exceeding 0.8.

More specifically, in contrast to the conventional liquid spinning process for applying a dielectric layer to a wafer substrate, the dielectric is applied to the wafer as a film, the film being a sheet of porous, expanded polytetrafluoroethylene (PTFE) containing a resin as a coating and at least partially penetrating into the pores of the PTFE. This provides a high degree of flexibility in resin selection. Dielectric thicknesses can range from about a minimum of 5 micrometers up, the thickness being controlled mainly by the expanded PTFE sheet which acts as a scaffolding. The expanded PTFE permits very thin films to be cast without pinholes. These composite films are then placed onto the wafer substrate and cured with heat and pressure, preferably in an autoclave as described in more detail below.

The selection of resin type is critical in achieving the desired properties of the dielectric. The fluoropolymer matrix provides the film forming, easily handled, improved material utilization and reduction in pinholes, it is largely the resin that provides the electrical, thermal, mechanical, and adhesive properties. The preferred resin system will vary depending on the thermal, electrical and mechanical requirements of the chip interconnect process as well as adhesive properties to itself and to various metals. Cyanate esters provide good electrical properties and reasonable thermal and mechanical properties at low cost, but would not be suitable in all cases. BCB provides good electrical properties as well as thermal properties and fair mechanical properties, but at much higher cost. Cyanate ester may be selected for wire bond chip interconnection, whereas BCB would be selected for solder bump interconnection.

By the process of this invention, utilization of the dielectric resin material can be improved to at least 50% and possibly greater than 80%, compared to about 5% with the conventional spinning process, resulting in tremendous cost savings compared to the spinning process. Potentially, even more significant cost savings can be obtained resulting from the reduction in processing steps required to create an integrated circuit element compared to the more labor-intensive spinning process.

The dielectric films produced according to the invention can be imaged quite well through a metal mask using laser ablation techniques or ion bombardment. The films planarize quite well as a result of the thermosetting resin component of the composite and the pressing configuration which uses the inorganic substrate as one of the flat surfaces and a highly polished caul plate as the other.

The basic steps in making the composite according to the invention are to coat and/or impregnate the porous, expanded polytetrafluoroethylene film with a solution of the resin in solvent or with molten resin and partially cure and/or dry the resin. These partially cured and/or dried composites are then laminated onto the wafer substrate, which typically may be silicon, gallium arsenide or ceramic, with or without electrical circuitry.

A detailed description of the invention and preferred embodiments is best provided with reference to the accompanying drawings wherein FIG. 1 depicts a roll system used to prepare and partially cure the dielectric layer for use in accordance with the invention. The matrix film 20 is supplied from supply roll 18 and passes through the nip between rolls 14 and 16 to an oven, not shown, for partial curing. The dielectric polymer 24 in solution or melt form is held in trough 22 and is supplied to gravure roll 10 and is transferred to transfer roll 12, then to roll 14 to be applied as a coating on matrix film 20 to form the composite dielectric film 26. Double-sided coating can also be effected by supplying additional resin between matrix film 20 and roll 16. These two methods are preferred for very thin, i.e., less than 12.5 micrometers, dielectric films. The degree of impregnation is controlled by the matrix film, the resin viscosity, the surface tension of the resin or solution, and the normal force applied between rolls 15 and 16.

For thicker films, that is for thickness exceeding 12.5 micrometers, the dielectric is made by first wetting a restrained EPTFE film with MEK. Then, while the film is wet, applying resin solution to one side while extracting the solvent out the other side with an absorbent paper. This is then dried and partially cured forming the dielectric film. This is then laminated over circuits as indicated in FIG. 2.

FIG. 2 illustrates a method of making the integrated circuit elements of the invention. Onto table 30, having channel 46 through which a vacuum is drawn, are placed a breather plate 32, highly polished caul plate 34, release film 36, which may be a fluoropolymer film such as PFA, dielectric layer 26 and wafers 38 having circuits 41 thereon, placed such that the dielectric polymer 24 in layer 26 is adjacent wafers 38, then release film 39, which also may be PFA, microporous film 40, which may be porous, expanded polytetrafluoroethylene, and non-porous cover layer 42, which may be aluminum foil, in that order. An O-ring 44 seals the entire assembly, and, simultaneously, heat and pressure are applied in the autoclave 48 and vacuum is drawn through channel 46.

After sufficient time under heat, pressure and vacuum, the assembly is taken out, cooled, and excess dielectric is trimmed away from the wafers 38.

FIG. 3 shows schematically the composite dielectric layer 26 of the invention comprising matrix layer 26B having the dielectric polymer 26A coated thereon and penetrating into the pores thereof.

FIG. 4 shows the integrated circuit element of the invention, including base wafer 38 having electric circuitry 41 thereon covered by dielectric layer 26. The top surface of dielectric layer 26 has a planarity exceeding 0.9 and can approach 1.0. Planarity is X/Y in FIG. 4.

FIG. 5 shows a multilayer integrated circuit element according to the invention.

The dielectric constant of dielectric layer 26 is less than 3.4 and may be less than 2.7. The dielectric polymer 24 may be as a coating on matrix layer 20, penetrating only partially into the pores of matrix 20, or it may penetrate into substantially all of the pores of matrix 20. The dielectric polymer may exceed the volume of the pores of matrix 20 leaving a resin-rich surface.

The dielectric layer 26 preferably is 25 micrometers or less in thickness and may be less than 12.5 micrometers thick.

The matrix layer 20 preferably is expanded, porous polytetrafluoroethylene, the wafers 38 are silicon, gallium arsenide or ceramic, with or without circuitry, the coating or impregnating dielectric polymer is a thermosetting polymer such as a cyanate ester, Benzocyclobutene (BCB) or a thermoplastic fluoropolymer or a preimidized polyimide.

The examples presented below are intended to be illustrative of the invention but are not to be construed as limiting the invention in any way, the invention being concisely defined by the claims below.

EXAMPLE 1

A cyanate ester resin (XU787.00, Dow Chemical Company, 100% solids) was heated to 100° C. to a melt state and zinc octoate was mixed in at 0.01 phr (parts per hundred). This liquid was applied as shown in FIG. 1 to a film of porous, expanded polytetrafluoroethylene (EPTFE, W. L. Gore & Associates, Inc., Elkton, MD) of basis weight 13 gram/meter$^2$, porosity of approximately 85%, at 15 feet per minute line speed. The coated matrix layer was heated in an IR oven at 177° C. for 30 seconds to partially cure the cyanate ester to the B-stage. The resin pick-up was 9.5 grams/meter$^2$.

The dielectric layer was placed on a release film of PFA over a caul plate, with the cyanate ester coating up. The wafers to be coated, circuitry down, were placed on the dielectric, a PFA release sheet was placed over the assembly and an EPTFE breather layer and aluminum foil were placed over the assembly (as shown in FIG. 2) and the assembly was placed in an autoclave for 90 minutes at 200 psi and 177° C., followed by 2 hours at 230° C. and 200 psi while simultaneously pulling a vacuum beneath the assembly to a pressure of 25 torr.

The assembly was removed from the autoclave, cooled, and excess dielectric was trimmed from around the wafers. Vias could be formed with an eximer laser using a metal mask, and these wafers could then be metallized.

The thickness of the dielectric layer was 15 micrometers and was planar to a degree of 2 micrometers over an electric circuit trace that was 7.5 micrometers in thickness. Planarity, thus, was 0.87. The dielectric constant for the composite was 2.5.

EXAMPLE 2

A polyimide resin (XU71787.06, Dow Chemical Company, 75% solids) was dissolved in MEK. The concentration of polymer in solvent was 75% by weight of solution. This solution was applied as shown in FIG. 1 to a film of EPTFE of basis weight 3 grams/meter$^2$, porosity of approximately 90%, at 10 feet/minute line speed. This produced a substantially filled matrix about 20 micrometers thick. The film of PTFE was coated on both sides simultaneously by depositing a puddle of resin at the nip between the film 20 and the roll 16 of FIG. 1. All other processing was the same as in Example 1. The planarity of the dielectric layer was approximately 0.9 over an electric circuit trace that was 7.5 micrometers in thickness. The dielectric constant for the composite was 2.7.

EXAMPLE 3

A 25 micrometer thick dielectric was made by first wetting a restrained 110 grams/meter$^2$ EPTFE film with MEK. Then, while the film was wet, the resin solution of Example 2 of about 50% solids was applied to one side while extracting the solvent from the other side with an absorbent paper. This was then dried and partially cured forming the dielectric film. This then was laminated over circuits that were 8 micrometers high as indicated in FIG. 2. The dielectric had a planarity as defined above of 0.9. This was measured by running a profilimiter (Tencor Instruments stylus) over the surface of the dielectric after it had been laminated over the circuit pattern. The dielectric constant of the composite layer was 2.7.

While the invention has been disclosed herein in connection with certain embodiments and detailed descriptions, it will be clear to one skilled in the art that modifications and variations of such details can be made without deviating from the gist of this invention, and such modifications or variations are considered to be within the scope of the claims hereinbelow.

What is claimed is:

1. An integrated circuit element comprising a base wafer having an integrated circuit thereon, said circuit being covered by a dry planar, substantially solvent-free dielectric layer, wherein said dielectric layer comprises a porous plastic matrix layer containing within at least some of its pores a dielectric polymer, said dielectric layer having a thickness in the range of 5 to 25 micrometers, the planarity of said dielectric layer being at least 0.8, and wherein said matrix layer is porous, expanded polytetrafluoroethylene.

2. The element of claim 1 wherein said dielectric layer has a dielectric constant less than 3.4.

3. The element of claim 2 wherein said dielectric layer has a dielectric constant less than 2.7.

4. The element of claim 1 wherein said dielectric polymer is contained within substantially all of the pores of said porous plastic matrix layer.

5. The element of claim 1 wherein said dielectric polymer is formed as a coating on said porous plastic matrix layer, said coating being adjacent said electric circuit.

6. The element of claim 1 wherein the volume of said dielectric polymer exceeds the void volume of the pores of said porous plastic matrix layer.

7. A multiple layer integrated circuit comprising a plurality of integrated circuit elements according to claim 1 bonded together.

8. The element of claim 1 wherein said dielectric layer has a thickness less than 12.5 micrometers and a dielectric constant less than 2.7.

9. The element of claim 1 wherein said base wafer is silicon.

10. The element of claim 1 wherein said base wafer is gallium arsenide.

11. The element of claim 1 wherein said base wafer is ceramic.

12. The element of claim 1 wherein the base wafer is a multilayer inorganic composite layer.

13. The element of claim 1 wherein said dielectric polymer is a thermosetting polymer.

14. The element of claim 1 wherein said dielectric polymer is a low ionic content thermosetting polymer.

15. The element of claim 2 wherein said dielectric layer has a dielectric constant of 2.7.

16. The element of claim 1 wherein said dielectric polymer is a thermoplastic.

17. The element of claim 16 wherein said thermoplastic is a preimidized polyimide.

* * * * *